(12) United States Patent
Kolman

(10) Patent No.: US 7,073,109 B2
(45) Date of Patent: Jul. 4, 2006

(54) METHOD AND SYSTEM FOR GRAPHICAL PIN ASSIGNMENT AND/OR VERIFICATION

(75) Inventor: Robert S. Kolman, Longmont, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 456 days.

(21) Appl. No.: 10/676,517

(22) Filed: Sep. 30, 2003

(65) Prior Publication Data

US 2005/0071715 A1    Mar. 31, 2005

(51) Int. Cl.
*G01R 31/28* (2006.01)

(52) U.S. Cl. .......................................... 714/724; 714/27

(58) Field of Classification Search .................. 714/25, 714/724, 27, 46; 716/8, 1; 327/565
See application file for complete search history.

(56) References Cited

U.S. PATENT DOCUMENTS

| | | | |
|---|---|---|---|
| 4,015,200 A | 3/1977 | Strandh | |
| 4,194,113 A | 3/1980 | Fulks et al. | |
| 5,448,166 A | 9/1995 | Parket et al. | |
| 5,504,432 A | 4/1996 | Chandler et al. | |
| 5,588,114 A * | 12/1996 | Bhatia | 714/25 |
| 5,682,392 A | 10/1997 | Raymond et al. | |
| 6,049,896 A * | 4/2000 | Frank et al. | 714/46 |
| 6,191,570 B1 | 2/2001 | Chandler et al. | |
| 6,275,962 B1 | 8/2001 | Fuller et al. | |
| 6,324,485 B1 | 11/2001 | Ellis | |
| 6,365,859 B1 | 4/2002 | Yi et al. | |
| 6,377,901 B1 | 4/2002 | List et al. | |
| 6,397,361 B1 | 5/2002 | Saitoh | |
| 6,405,355 B1 * | 6/2002 | Duggirala et al. | 716/8 |
| 6,449,744 B1 | 9/2002 | Hansen | |
| 6,496,058 B1 * | 12/2002 | Hong | 327/565 |
| 6,556,938 B1 | 4/2003 | Rohrbaugh et al. | |
| 6,577,980 B1 | 6/2003 | Shepston et al. | |
| 6,704,910 B1 * | 3/2004 | Hong | 716/1 |

FOREIGN PATENT DOCUMENTS

EP    1 092 983 A1 *   4/2001

* cited by examiner

*Primary Examiner*—David Ton

(57) ABSTRACT

A method, a system and/or a computer readable medium for accessing design data including an electronic image of an integrated circuit to be tested; determining whether a pin of the integrated circuit has been assigned to a port in a multi-port automated test environment; enabling a displayable pin indicator based in part upon the determination of whether a pin is assigned to a port; and displaying the electronic image and the displayable pin indicator.

24 Claims, 9 Drawing Sheets

METHOD AND SYSTEM FOR GRAPHICAL PIN ASSIGNMENT AND/OR VERIFICATION

BACKGROUND OF THE INVENTION

An important aspect in many manufacturing processes is the testing of the manufactured products. Testing is utilized to verify that the manufactured products function and operate properly and perform in accordance with the specifications set forth by the product design. There are often a plurality of tests which may be performed on the product or products at different points or stages in the manufacturing process. For example, after a particular sub-assembly of a product is manufactured, there may be tests performed to verify the specific functions of the sub-assembly prior to its incorporation into an overall final product. In addition to or oftentimes as a preferred alternative to separate testing of the sub-assemblies or sub-components, there may be tests that can be performed on the final overall completed product including the one or more sub-components after the final step of the manufacturing/assembling process.

In order to meet an ever increasing demand of consumers for the latest high technology products, manufacturers are forced to constantly design and deliver these new products to the marketplace in an ever decreasing time span. Techniques that shorten the time needed to bring a product to market can provide a competitive advantage over competitors who do not have access to such techniques. Consequently, any such techniques or mechanisms to shorten the time-to-market are desirable and may be readily accepted by manufacturers.

Shortening the total test time required to adequately test the functionality of the manufactured products is one way to decrease the time required to bring a new product to market. The total test time may typically be a function of one or more factors, e.g.: (1) the run time of the test, i.e., the time it takes to actually perform a particular test on the device, and (2) the test set-up time, i.e., the time it takes to configure and set-up the test equipment to perform the test. Thus, in order to decrease the total test time, it is desirable to find ways to shorten either or both of the run time and/or the set-up times of the tests.

Heretofore, integrated circuit (IC) and/or system on a chip (SOC) devices have been tested and verified using a variety of test methods. In some examples, IC and/or SOC devices have been tested and verified to be defect free using functional test vectors, such as those applied to the IC and/or SOC by the use of automated test equipment (ATE), which stimulate and verify the IC/SOC device functionality at the pin-level of the device. A practical limitation to the utilization of ATE for testing ICs or SOCs, however, is the identification and verification of the proper port assignments of IC/SOC pins (or pads) that are to be tested by a particular ATE. This has, heretofore, been limited by one or more of the physical configuration of the ATE and/or the physical and visual steps of confirmation by a human operator. This conventional solution for determining whether pins are properly assigned to ATE test ports is a manual process which is tedious and prone to human error.

For instance, the number of pins or pads of the IC/SOC to be tested may not match, i.e., the pins or pads may simply not have been adequately or accurately defined in relation to the test channels or ports provided by an ATE. Similarly, the number of pins or pads may be less or more than the number of test channels or ports provided by an ATE, or the ATE test program. Alternatively, it is possible that pins or pads may have been overlooked during the manual assignment of pins to ports in a "multi-port" test environment. Eventually, these pins or pads may be found, manually or by a computer, but usually with a time delay and the associated "cost" thereof.

Note as used herein, the terms "pin" or "pad" are used to refer first to either or both sorts of electrical communication devices. Hereafter, reference to a pin thus also refers to and includes reference to a pad, and vice versa, reference to a pad refers to and includes a pin. Also these terms are intended to refer collectively to both a physical site, which serves as an electrical contact for an IC and/or an SOC, as well as circuitry associated with the physical site for enabling electrical communication between components of the IC and/or SOC and components external to the IC and/or SOC.

The IC and/or SOC includes at least a first pin or pad disposed to electrically communicate with at least a portion of the ATE, with the first pin or pad being configured as a signal interface for components external to the IC/SOC. These may thus form systems for measuring a parameter of or communicated through a pin or pad of an IC/SOC. Preferably, such systems include automated test equipment (ATE) configured to electrically interconnect with the IC/SOC and to provide at least one signal to the IC and/or SOC. The IC and/or SOC is adapted to electrically communicate with the ATE so that, in response to receiving a test signal from the ATE, a response is then communicated back to the ATE which then measures at least one parameter of or communicated through the first pin. An ATE test protocol which is adapted to measure at least one parameter of or communicated through the first pin is also provided.

Note further that automated test equipment (ATE) typically provides the ability to test a wide variety of integrated circuits (ICs) and/or systems on chips (SOCs) using a wide variety of tests. For example, and not by means of limitation, the following test capability may be provided by the ATE, including: the ability to measure time, voltage, current, resistance, capacitance, inductance, frequency and/or jitter; the ability to measure, at specified times, voltage, current, resistance, capacitance, inductance, frequency and/or jitter; the ability to provide data; the ability to drive data at specified times; the ability to receive data; the ability to receive data at specified times; the ability to provide reference voltage; the ability to sink or source current; the ability to provide high impedance; and the ability to calibrate in relation of the ATE to the IC/SOC, among others.

As utilized herein, the term IC hereafter is intended to include and refer to an SOC as well, and the reverse is also intended, vice versa, i.e., the term SOC may also be used to refer to and include an IC. Note, SOCs may be considered special kinds of ICs wherein SOCs are devices which may contain an assortment of one or more circuit features such as intellectual property (IP) blocks including, for example, logic cores, memories, embedded processors, and/or a range of mixed-signal and RF cores to support voice, video, audio and/or data communications. Thus, SOCs may represent a sort of IC integration, where stand-alone IC chipsets are merged into a few or even into a single SOC. To save on development costs, several SOC vendors today are creating converged ICs that include a wide range of computational, communication, and/or entertainment functionality. Such devices may require many or all of these capabilities because their jobs may include obtaining data and/or executable code from or through various communication methods and/or protocols, decoding that data and/or code and then displaying, distributing and/or storing that data and/or executing the code to operate in accordance therewith.

However, given that these converged SOCs may be highly elastic in the capabilities they will provide, the exact test requirements for each SOC is a function of the IP blocks integrated therein and the test strategies defined by the engineering staff. Also, these converged SOCs will typically require a full gamut of testing capabilities; from RF and mixed signal to high-speed digital, memory, and scan test. To test the various IP blocks using traditional ATE equipment often requires multiple insertions utilizing multiple point solution testers. This may not present a cost-effective approach for many consumer-oriented devices. To keep test costs under control, one optimal solution may be to use one test platform that provides a full range of test resources. Creating and maintaining one general test program for a single platform may be much less expensive than having to deal with multiple test programs and/or platforms. Moreover, the use of one test platform offers an opportunity to test IP blocks in parallel, opening the way for higher levels of concurrent testing, and test-time efficiencies.

Parallel or concurrent test strategies can be enhanced by the use of a plurality of otherwise separate ports or channels in the ATE. A port is a connection on or from the ATE to a collection of one or more pins in/on the IC/SOC. Independent tests may then be performed concurrently or in parallel using separate ports so long as the pins are properly and separately assigned to separate ports. For example, a certain first set pins on an SOC may be dedicated to a particular IP core on the SOC, and a second set of pins may similarly be separately dedicated to a second particular IP core on the same SOC; then, each of these sets of pins may then be assigned to separate ports on the ATE, and thus provide for separate and parallel, i.e., non-sequential testing of those two IP cores. This can then reduce test time. Reduced test time assumes however, that the pins are properly assigned to the appropriate ATE ports during test set-up.

Thus, there is a need for improved systems and methods which address this and other issues of the prior art.

SUMMARY OF THE INVENTION

Disclosed here are one or more methods, systems and/or apparatuses for accessing design data including an electronic image of an integrated circuit to be tested; determining whether a pin of the integrated circuit has been assigned to a port in a multi-port automated test environment; enabling a displayable pin indicator based in part upon the determination of whether a pin is assigned to a port; and displaying the electronic image and the displayable pin indicator. Alternatively other disclosures include one or more methods, systems and/or apparatuses for developing at least a portion of an integrated circuit test in a multi-port automated test environment including accessing design data including an electronic image of an integrated circuit to be tested; determining whether a pin of the integrated circuit is assigned to a port in a multi-port automated test environment; indicating with a displayable indicator the result of the determining step; and assigning a pin to a port as a result of the determining and indicating steps.

Still further disclosures are directed to one or more methods, systems and/or apparatuses for developing at least a portion of an integrated circuit test in a multi-port automated test environment, including an automated test controller which is adapted to communicate test information to automated test equipment, said controller also being adapted to provide for: accessing design data including an electronic image of an integrated circuit to be tested; determining whether a pin of the integrated circuit is assigned to a port as desired; and assigning such pin to a port if not assigned as desired.

Additional apparatus and or system disclosures include a computer readable medium; wherein a computer program is stored on the computer readable medium, the computer readable medium being adapted for developing at least a portion of an integrated circuit test in a multi-port automated test environment; said computer program having program code to access design data including an electronic image of an integrated circuit to be tested; program code to determine whether a pin of the integrated circuit is assigned to a port; and program code to assign such pin to a port if not assigned as desired.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION

Figure 1:
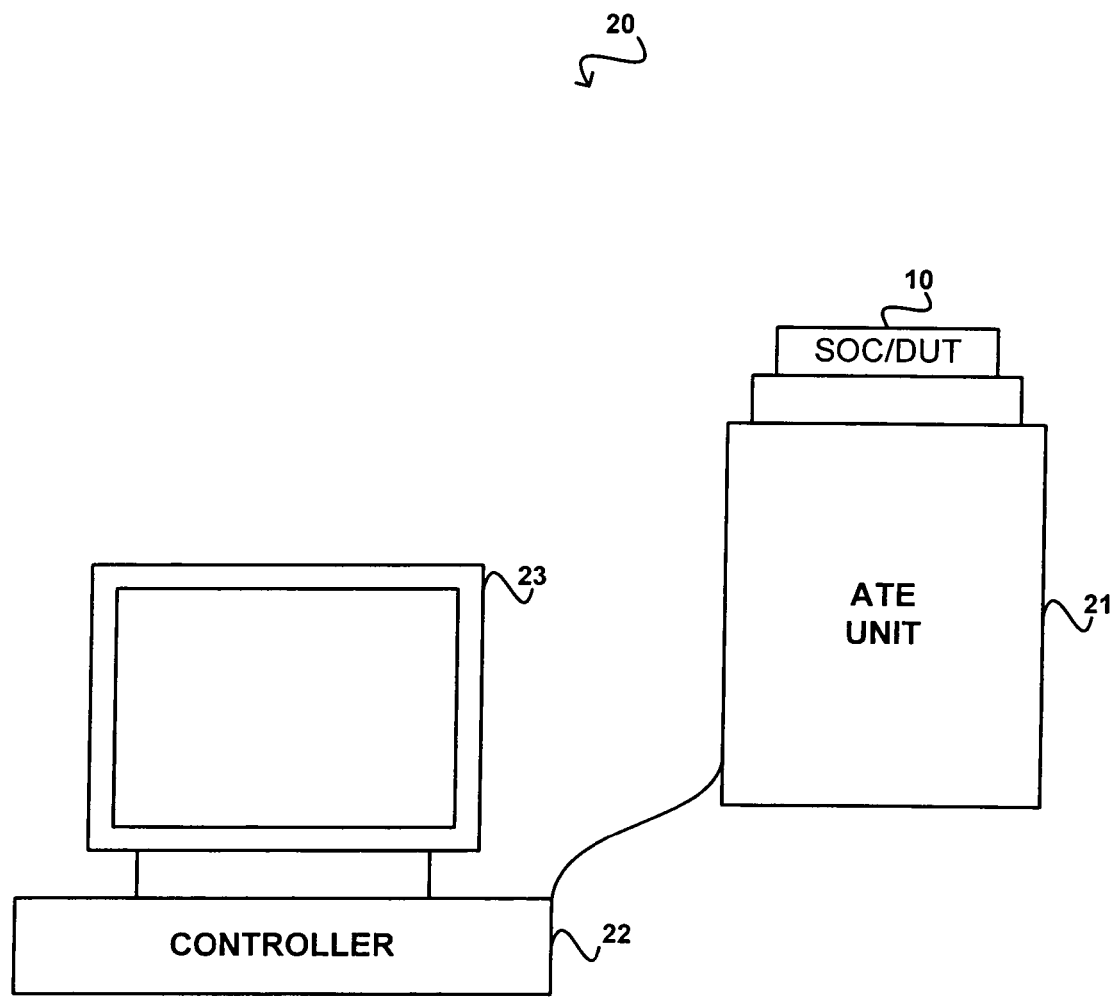
FIG. 1 is a schematic diagram depicting exemplary automated test equipment and an exemplary integrated circuit and/or system on a chip to be tested therewith.

Reference will now be made in detail to the description of the invention as illustrated in the drawings with like numerals indicating like parts throughout the several views.

As mentioned briefly hereinbefore, automated testing of an integrated circuit or a system-on-a-chip has been known. Embodiments of the present invention may be useful with integrated circuits, ICs, generally, or in many cases, more particularly with systems-on-chips, SOCs. As shown in FIG. 1, an integrated circuit 10 may represent either an IC generally, and/or an SOC. Reference to either herein includes the other. SOC 10 may also be referred to or known as a device under test, or DUT, or by similar nomenclature. As further shown schematically in FIG. 1, SOC/DUT 10 may be connected in an overall test system 20 to automated test equipment 21. ATE 21 may have attached thereto or incorporated therein a test controller 22. Test controller 22 may further include input and/or output devices such as the display screen 23 shown and/or a keyboard, mouse, stylus, scanner, disk drive or other computer connection (a serial port, a local access network connection, cable, Ethernet, WiFi, or the like).

Figure 2:
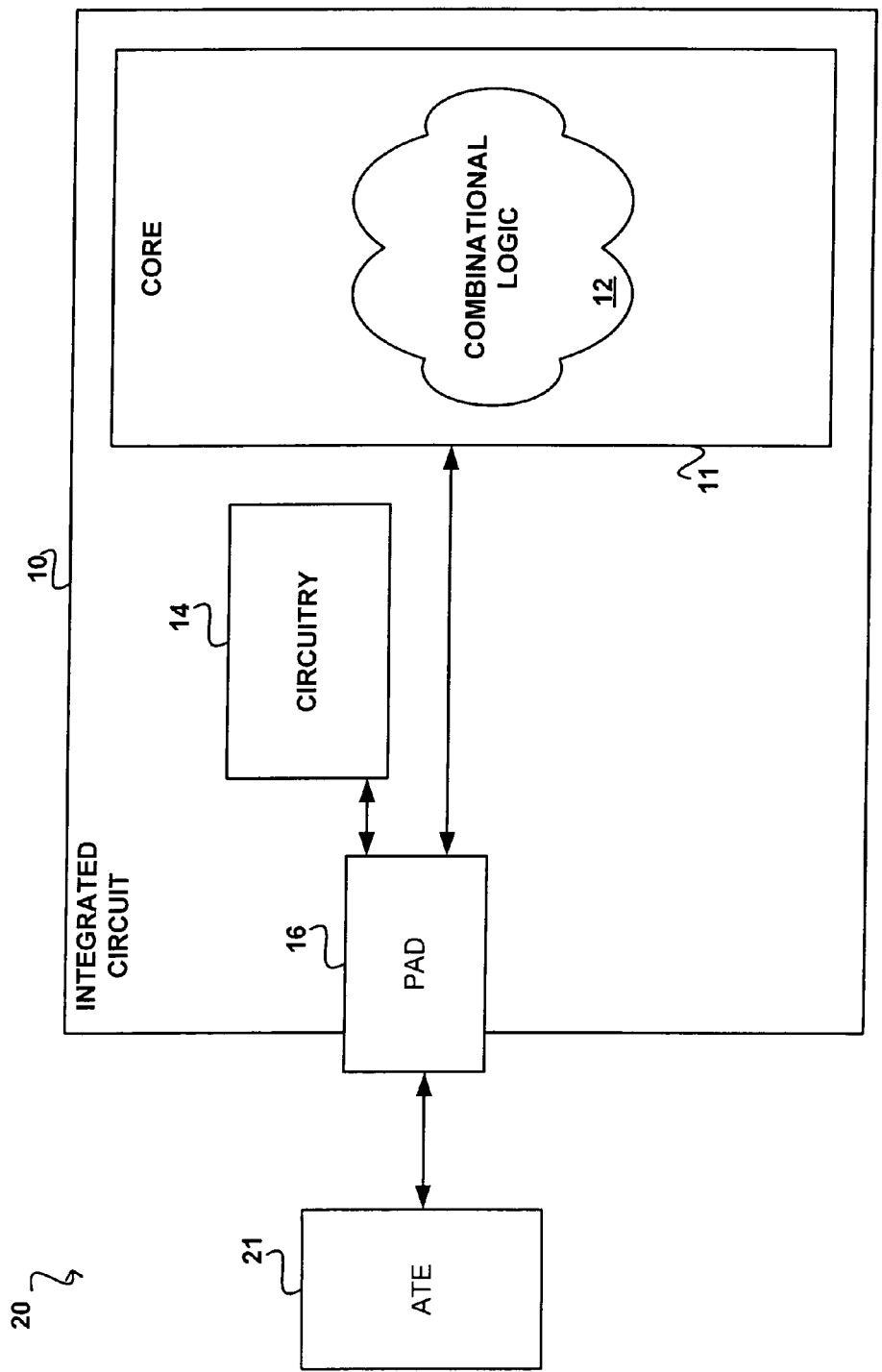
FIG. 2 is another schematic diagram depicting exemplary automated test equipment and an exemplary integrated circuit and/or system on a chip to be tested therewith.

Referring now to FIG. 2, IC or SOC 10 may then also include one or more cores 11 which may incorporate combinational logic 12. SOC 10 and/or core(s) 11 may either or both also include other integrated circuitry 14. Core 11 and/or circuitry 14 electrically communicate(s) with at least one pin or pad 16 which is configured to electrically communicate with devices external to the SOC 10, such as automated test equipment (ATE) 21, for example. So configured, an external device, e.g., ATE 21, may deliver signals to or receive response signals from the core 11 and/or other circuitry 14 via a transmission path which may include a pin or pad 16. When such communication is thus established, an overall test system 20 is created.

The ATE 21 may be configured to provide functional-based testing of circuitry contained in/on SOC 10 (e.g., circuitry 14), and/or more particularly, may provide testing for the combinational logic 12 within the one or more cores 11. In order to accomplish such testing, the ATE 21 typically incorporates a stimulus generator and a response analyzer. More specifically, the stimulus generator in the ATE 21 may be configured to provide one or more test patterns for testing logic circuitry of the core 11. The pattern or patterns provided to the logic circuitry may include digital data, i.e., zeros and ones. In response to the various patterns, the logic circuitry under test then provides a response signal or signals to the response analyzer which is able to interpret the response and provide a test result signal which may otherwise be communicated or used by the ATE or the operator of the ATE for purposes known in the art and/or as may be further explained below. Thus, the ATE provides for digital, functional testing of the core by applying digital test patterns to the logic circuitry of the core. Such automated testing has, heretofore, been substantially provided for by such external test equipment, i.e., ATE 21, by the generation and provision of digital patterns to the integrated circuit and/or SOC for facilitating testing of the logic circuitry thereof.

Figure 3:
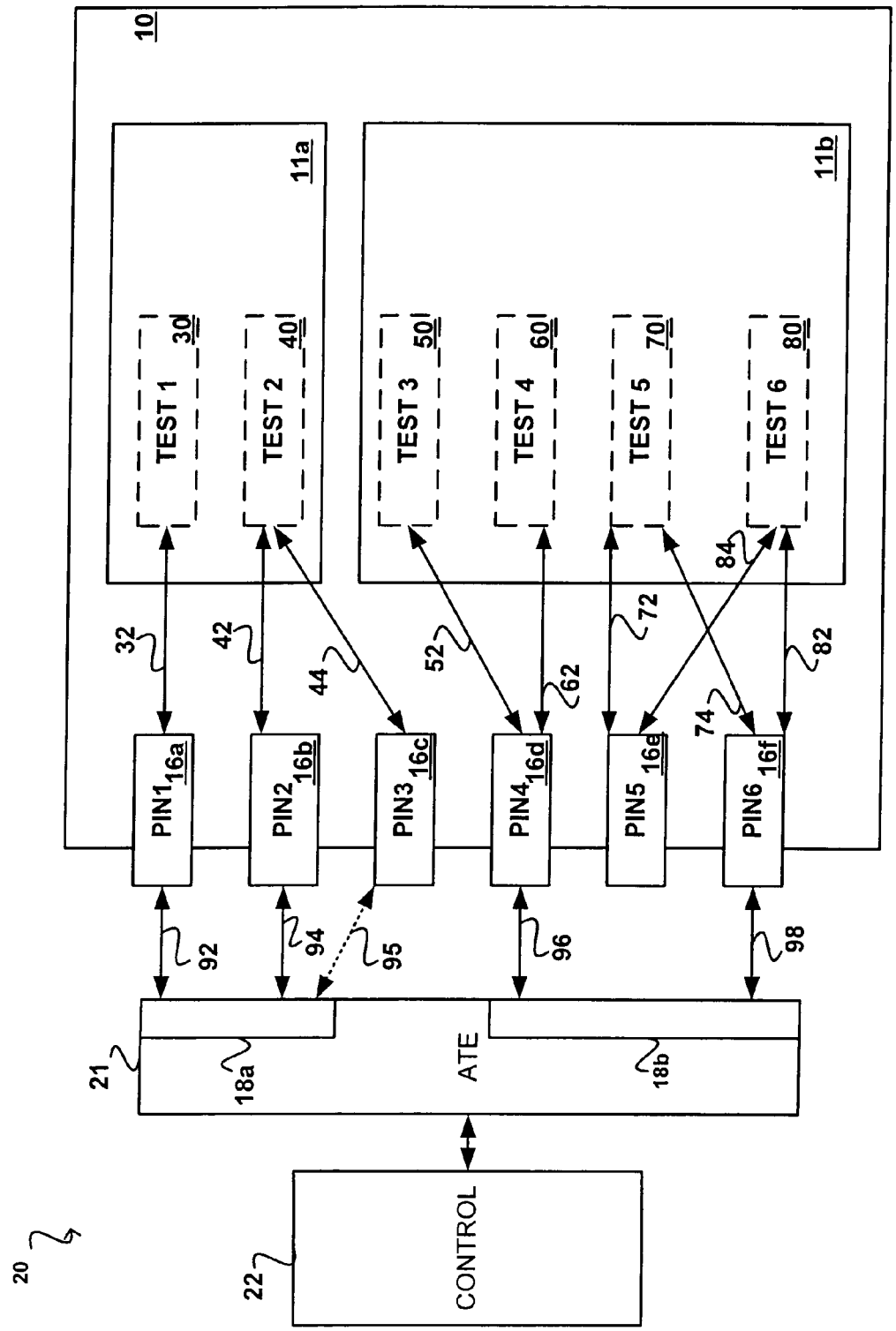
FIG. 3 is yet another schematic diagram depicting exemplary automated test equipment and an exemplary integrated circuit and/or system on a chip to be tested therewith.

General characteristics of a preferred embodiment of the analog and/or digital parameter test system 20 useful in and/or with and/or as otherwise operatively associated with the present invention will now be described in reference to the schematic representations in FIGS. 2 and 3. As introduced above, system 20 incorporates an ATE 21 with a control 22 and an SOC 10 which may include one or more cores 11. As shown in FIG. 3, an SOC 10 may include a plurality of cores 11 e.g., cores 11a and 11b. The core or cores 11 (and more particularly the combinational logics thereof, not separately shown in FIG. 3) electrically communicate with one or more pins or pads 16, e.g., the six pins 16a–16f shown in FIG. 3, which pins are then configured to allow intercommunication of the combinational logic of the cores 11 with external devices, such as ATE 21, for example.

As described in detail hereinafter, ATE 21 may preferably be configured to provide selected/selectable ATE functionalities on one platform and, thereby, reduce the necessity for separate specialized automated test equipment for testing integrated circuits of various configurations. Such select-ability of functionalities may, inter alia, be a result of the alternatively re-definable multi-port structure/system represented schematically by the ports 18, e.g., ports 18a and 18b in/on ATE 21 in FIG. 3. Such ports 18a and/or 18b may be defined to be communicative with one or more pins 16 of SOC 10. For example, port 18a is shown defined to communicate with pin 1 16a and pin 2 16b shown schematically via respective schematic communication lines 92 and 94. As described further below, pin 3 16c may or may not also be defined to be communicative with port 18a as shown by the dashed line 95. Similarly, port 18b may be defined to be communicative with pins 4 and 6 16d and 16f (and alternatively also pin 5 16e, though not shown) via respective schematic communication lines 96 and 98 (note, as understood, not all pins, e.g. pin 5 16e need be assigned to or otherwise communicate with a port or with the ATE). Defined this way, port 18a is defined to be communicative only with the pins of core 11a and not with any of the pins of core 11b while port 18b is conversely defined to communicate only with the pins of core 11b and not with any of core 11a. As will be described, this pin/port definition structure/method provides for the desirable parallel concurrent testing of the two cores 11a and 11b.

For example, as further shown in FIG. 3, six exemplar tests are shown schematically (dashed lines) relative to cores 11a and 11b (note these tests are not generally intended to, though they could, represent structures, and are thus shown in dashed lines). These six tests are labeled as Test 1 30, Test 2 40, Test 3 50, Test 4 60, Test 5 70 and Test 6 80. The various tests may then involve electrical signals which are then electrically communicable/communicated to/from ATE 21 via respective pins 16 in a variety of path configurations. For instance, test 30 involves the communication of signals (to/from port 18a and ATE 21) through pin 16a via schematic transmission path 32 in/on SOC 10; and test 40 involves the communication of signals in/on SOC 10 via each of pins 16b and 16c utilizing schematic transmission paths 42 and 44 respectively. Similarly, tests 50 and 60 may each be represented by the electrically communicated signals passing to/from pin 16d via transmission paths 52 and 62 respectively; while test 70 communicates with pins 16e and 16f via transmission paths 72 and 74 respectively; and test 80 also involves electrical communications with pins 16e and 16f, albeit, via separate transmission paths 82 and 84 respectively. Thus, an SOC 10 may incorporate various configurations of electrical signal intercommunications between the various pins and various cores, as well as various pin types and various test types.

Then as illustrative examples, and not for the purpose of limitation; it may be seen that an SOC 10 (and/or the circuitry, and/or cores thereof) may be tested by electrical signal communication with an ATE 21 via one pin (e.g., test1 30 via pin1 16a signals to and from the core 11a) and/or via multiple pins (e.g., test2 40 utilizing multiple pins, e.g., pin2 16b and pin3 16c, whereby signals may be sent to and/or from core 11a via one or the other or both; note, pin3 may or may not be connected to the ATE in this situation, depending upon the type of test test2 might be). Similarly, the various pins could be used in more than one test each (e.g., test3 50 and test4 60 both using the same pin4 16d and likewise, test5 70 and test6 80 both making use of pin5 16e and pin6 16f). Note, it is likely that if one or more pins is used for more than one test, then the tests may likely not be run concurrently, but rather separated in time, sequentially or otherwise. Note also, it is also possible that the pins could be used for more than one test and more than one core, but if so, then those tests would also likely have to be run at separate times, sequentially or otherwise, and thus, the cores with such overlapping pin definitions would likely have to be tested separately (at least for those tests), sequentially or otherwise.

As mentioned above, the ATE typically provides the ability to test a wide variety of integrated circuits and/or SOCs. However, oftentimes, the full testing capability of a given ATE is usually not required to test a specific type of integrated circuit. Additionally, oftentimes, the number of pins and/or pads of an integrated circuit or SOC may not have conventionally been, at least in an initial test program generation (particularly if developed by conventional computer generation programs), adequately matched to the appropriate test channels or ports of a given ATE, thereby conventionally necessitating manual, visual operator verification and/or assignment of a number of pins or pads with appropriate ATE test channels or ports, thereby conventionally necessitating excess test set-up procedures and time. The most usual instances for the methods and/or apparatuses disclosed herein may involve those multi-port test cases, where pin assignments to particular ports will aid in the overall test process such that particular parts (e.g., cores) of a particular IC/SOC may be tested separately, yet concurrently via the separate ports into and/or from the ATE.

Thus, according to the present invention, the testing of integrated circuits, such as an IC and/or SOC 10, may be implemented utilizing an ATE 21, which is enhanced by the inclusion of the present test set-up capability in an ATE which provides for the matching of pins to ports in a more simple and orderly fashion. Briefly described, embodiments of the present invention may provide one or more improvements in the use of automated test equipment functionality with integrated circuits and/or systems-on-chips. A visual identification system may use an image of the device under test to show the test developer rapidly, in some cases virtually immediately, where any unassigned or mis-assigned pins may be located. The presentation method can further be made to dynamically interact with test procedure editing capabilities. This may then allow the user to click on a highlighted (unassigned or otherwise mis-assigned) pin, and be taken directly to a pin assignment or editing capability. The user could then either learn more (verifying the pin should remain unassigned or mis-assigned), or, the user could then assign the pin to one of the available ports. The user could also create a new port at that time. This invention could thus provide a rapid identification of all pins that are not assigned or mis-assigned in an automated test environment, as for example within a multi-port framework. Since these un- or mis-assigned pins may then be proactively presented for analysis, the user could be saved wasted time, potentially speeding up the multi-port test development process. Particular examples are shown in FIGS. 4–9 as will now be described in more detail.

Figure 4:
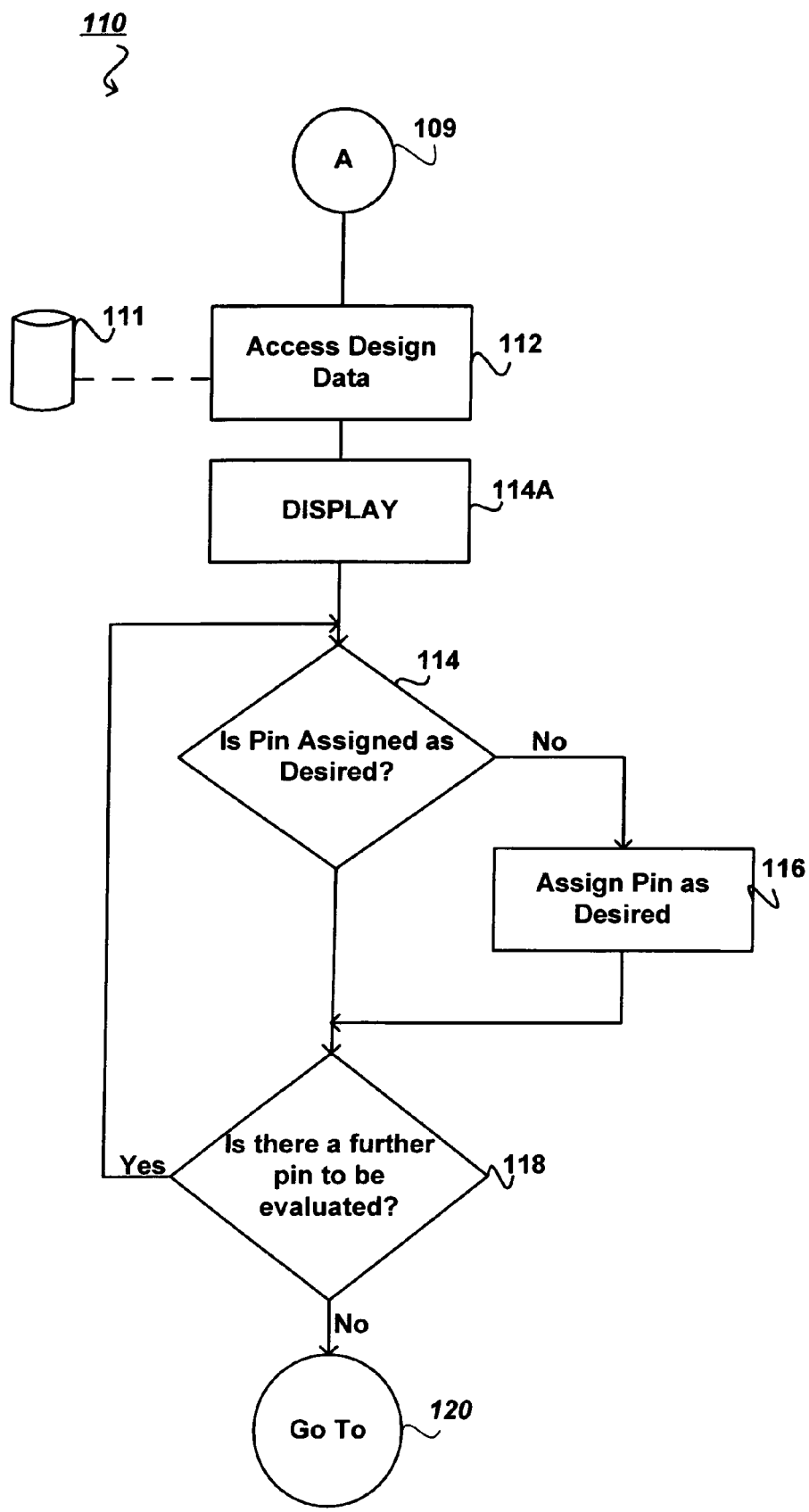
FIG. 4 is a flowchart depicting the functionality of an exemplary embodiment of the present invention.
Figure 5:
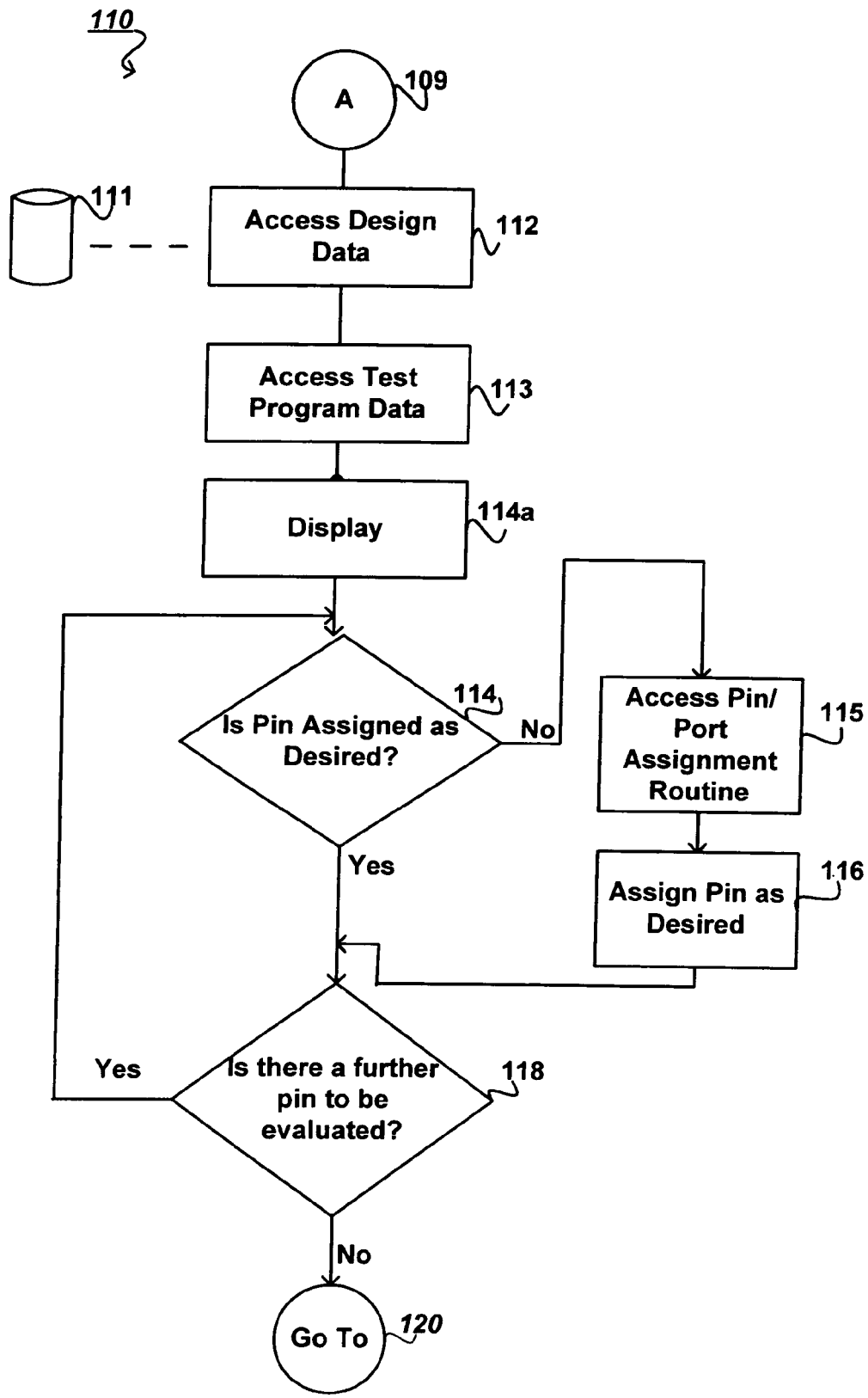
FIG. 5 is another flowchart depicting the functionality of an exemplary embodiment of the present invention using an alternative methodology.

The flowcharts of FIGS. 4 and 5 (as well as FIGS. 7 and 9, see below descriptions thereof) show the functionality and operation of preferred implementations of a test system 20 such as is depicted in FIGS. 1–3. In this regard, the flowcharts themselves and/or each block of the respective flowcharts may also represent a method step which may also represent a module, segment or portion of program code or logic which comprises one or more executable instructions for implementing the specified logical function or functions. It should also be noted that in some alternative implementations the functions noted in the various blocks may occur out of the order depicted in the particular flowcharts. For example, two blocks shown in succession in any of the flowcharts may, in fact, be executed substantially concurrently, or the blocks may sometimes be executed in the reverse order depending upon the functionalities involved.

As depicted in one preferred embodiment, as in FIG. 4, for example, test system or method 20 may preferably include a flow path 110. Note, this system and/or method may involve an IC and/or SOC to be tested in an electrical interconnection with an ATE 21. However, this system and/or method may take place during, after or before the actual interconnection of the SOC or IC with the ATE. Thus, these general flow paths will not necessarily include, but also do not preclude such an interconnection. Thus, beginning first with block 112, in FIG. 4, design data corresponding to the IC and/or SOC to be tested is accessed (looked-up, downloaded or otherwise received or retrieved). Such design data may include some sort of a graphical representation of the IC/SOC package, such as a graphical representation which may usually have been the result of the computer aided/assisted design (CAD) or computer aided/assisted manufacture (CAM) process. Note, though addressed later, this design data may also include (separate from or connected to the graphical data) test program information (potentially including pre-assignment of pins to ports), and/or it may include other information relating to the type of IC and/or SOC, the type(s) of analog and/or digital test circuitry, the type(s) of test(s) to be conducted, and/or electrical continuity information corresponding to the interconnection of the ATE and the IC and/or SOC, among others. A text list of the IC/SOC pins may also be made available with the graphic representation as a part thereof and/or separately therefrom. The design data may be provided in numerous manners, such as by being provided in the form of a CAD or CAM computer file downloaded from an original computer file location to the controller 22 (or another test set-up device or location; i.e., though test set-up may preferably be performed at/on the controller 22 of the ATE 21, this is not necessary). It may also be accessed through operator input at a work station, for instance, directly on controller 22. Note, the step of accessing may include the sub-steps of calling for and/or receiving the data from a data storage location which is represented schematically as computer memory 111 in FIG. 4. Calling for the data may require operator inputs at/on the controller 22 with a subsequent electronic communication of the data request to the computer memory 111 with the subsequent transfer of the data to the controller 22 (or other test set-up location).

The first step 112 may also include a step of displaying the design data, i.e., the graphical representation of the IC/SOC package, for example displaying the graphical representation on a display screen directly, such as on screen 23 (see FIG. 1). Or, rather than being a part of the step of accessing the design data such a display step may be separate from or occur afterwards as shown in FIG. 4 by the second step 114a. Other processes or steps to enhance such a display may also be performed at or near this time (before or after), such as conditioning or otherwise manipulating the design data to provide optimal or otherwise preferably useful images for display. Such a step or set of sub-steps may also involve a sort of data search and/or evaluation whereby all desirable component parts shown in the drawing are given or are found to have or are ensured to have been given an operable name for identification purposes during display. Examples of such data manipulation may include associating pin name data with the graphical representation thereof (if not already co-existent therewith as part of the graphic data); sizing or rotating or spinning or otherwise dimensioning (creating 3D from 2D or vice versa) or framing (e.g., reducing (or enhancing) details from the CAD or CAM drawing to a reference framework) the graphical representation so that the viewability of the appropriate and/or desired pins is enhanced; or creating representative graphic pin elements such as dashed line representations of otherwise hidden pins (e.g., hidden underneath or packed too closely) on or adjacent the IC/SOC package.

In any event, after accessing the design data, the process 110 preferably proceeds to the decision diamond 114 where the data is evaluated/verified, i.e., a determination is made as to whether a pin or pins of the IC/SOC device have been assigned. In various embodiments, this may proceed either groupwise evaluating all or some groups of pins at one time, or on a substantially pin by pin basis such that if a first pin is evaluated, and ultimately determined to be properly assigned or is assigned using the side process step 116, then, the process moves to diamond 118 where it is determined whether there is another pin to be evaluated, and if so, the process returns to diamond 114. The subsequent pin can then be evaluated and so on, until there remain no further pins (as determined at diamond 118) to be evaluated. Note, a pin-by-pin basis may better describe the optional human operator intervention/evaluation as described further below (e.g., the human may view a display of the graphic image (see below) and evaluate the assignments pin by pin, one at a time), though it is also possible that such a human operator may alternatively be able to evaluate by groups or by an entire pin set (e.g., multiple pin selection and group assignment might add desirably to the functionality and ease-of-use of this feature). Then, this evaluation/verification process can be ended, however, it will often generally be a part of or otherwise feed ultimately into an overall test set-up procedure or even more directly into the overall test process. Thus, the completion of these evaluations will then lead to the GoTo circle 120 which leads either to another test set-up phase, or ultimately to the overall test process (not shown).

Note, the performance of the evaluations 114 and 118 and the side assignment step(s) 116 (sometimes referred to as a pin editing capability 116) may have various embodiments. In a first such alternative case, the evaluation is as to whether the IC/SOC pin or pins have indeed been assigned as desired. In one sub-set case, this invention may be involved with determining that prior to this process 110, no pins of the IC/SOC 10 have been assigned, and thus all will have to be evaluated and assigned using the evaluations here, or otherwise. Thus, this process 110 may find itself as an integral part of the overall test program generation process. In various other cases, however, many of the pins may have been assigned by other means previous to invocation of this process 110. For example, other known or otherwise established test generation programs may be used to create test program pin assignments to particular ports; indeed, the definition of pin groups and/or ports may preferably be performed using such other processes. Such processes either program the pin to port definitions substantially automatically, or allow the user to enter and edit pin information describing the pins of the Device Under Test (DUT; e.g., IC and/or SOC) by the ATE. Examples of such processes and/or programs include software such as the HPSmarTest™ program at one time available from Hewlett-Packard Co., Palo Alto, Calif., and SmarTestPG™ and Pin Editor™ programs available from the assignee of the present invention, Agilent Technologies, Inc., Palo Alto, Calif. Thus, this process 110 may find itself as a verification of and/or accessory or other adjunct to or otherwise cooperative with such other pin to port assignment tools.

As such an adjunct, this process or sub-routine 110 may thus use the information developed by such other test program(s) and run a sort of comparison evaluation. This process 110 may be an example of a verification of appropriate/desired pin port assignments. Accessing such other test program data may thus take place at or before the beginning of the process 110, as for example at or before the start circle 109 shown in FIG. 4. Otherwise note, such data may be accessed during or after the design data acquisition at block 112 as shown by block 113 in FIG. 5 (again, even though not shown, steps 112 and 113 can be performed in either order or substantially simultaneously). The general process 110 may then proceed generally as before; however, it also might be preferred in such an adjunct or sub-routine situation that the actual assignment of a pin to a port (or pins to ports) be performed by the test generation program referred to above; thus, if it is determined at step 114 that a particular pin is not assigned as desired, then the next step may be to access the pin/port assignment tool or routine as at step 115. Then, the rest of the process may proceed as before.

Figure 6:
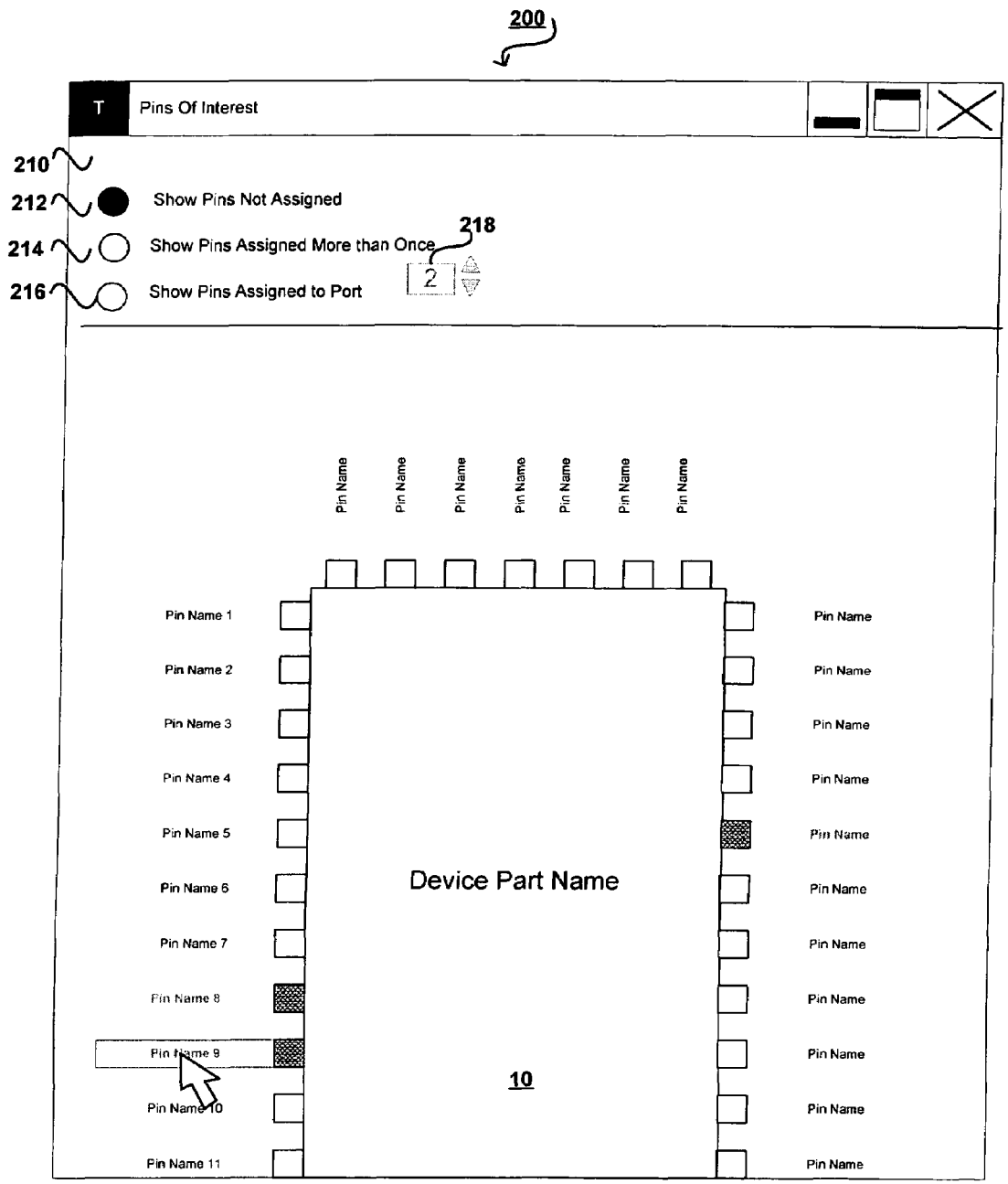
FIG. 6 is a portion of a graphical user interface screen according to an exemplary embodiment of the present invention.

Various alternatives are available for the implementation of the various steps; however, some preferred alternatives (though not limiting the totality of available alternatives) include the use of a display of the design data as a graphical representation of the IC/SOC package 10 as shown for example in FIG. 6. Note again, the display of the data may first occur as a part of or after step 112 (as mentioned, see step 114a as it appears in FIGS. 4 and 5); however, this data may either be shown as is (i.e., there may be no information about what pins are or are not assigned, and thus all pins will be shown as not assigned), or the data may be conditioned either as part of or prior to step 114 to show as part of the display which pins are or are not assigned. This conditioning might then involve a search and/or the comparison of the test program data (including inter alia, potential pin pre-assignments) with and consequent highlighting of/on the graphical representation of the pins of interest. This conditioning and/or comparison and/or manipulation of the data from the pre-assignment of pins by another pin/port assignment program or process with the electronic graphical representation may, again take place before, or as part of the evaluation step 114, and this comparison may take a form of highlighting and/or the creation and/or enablement of one or more visual indicators used to indicate on the display screen the information according to steps 112 and 114a, 114 (and/or 113) about whether the pin or pins have been assigned. Note, if this comparison or evaluation takes place as a part of the evaluation step 114 then the display step 114a would or could also be a part thereof, or it could occur after the evaluation step (in either or both of the branch optional flows therefrom).

As an example of the resulting display, as shown in FIG. 6, two pins on the left hand side and one pin on the right hand side of the device 10 are shown highlighted with displayable pin indicators, here the pins being cross-hatched (though different fill-in styles or colors or shading, or other forms of highlighting, or enabled pin indications may be used, e.g., grayscaling, brightlining, blinking, shimmering, animating or circling or boxing or highlighting associated text together with or apart from the graphically represented pins, or adding additional highlighted text or otherwise for example, by enabling "pop-up" text or boxes of text when the computer cursor is appropriately located over or adjacent the pin). Note, this would likely require some computer analysis and comparison of the test program data with the graphic data and then some manipulation of the graphic image (e.g. highlighting or enabling a displayable indicator) to show the results of the computer analysis/comparison, i.e., that particular pins (e.g., pins 8 and 9, FIG. 6) are not assigned. This sort of computer involvement may also be understood as a computer "search" for those pins matching (or not matching) certain criteria, e.g., where "unassigned pins" are at one point the "pins of interest," the computer would then search the test development data to find those pins which have heretofore not been assigned to a particular port, and then reveal the results of that search by highlighting those pins on the graphical image. Furthermore, the graphical image of the particular device (IC/SOC or the like) may be of such a character that the density of pins is so high that alternative visual indications may be needed. As an example, a ball grid array device package is one exemplary form in which normal text labels may significantly collide in a normal view (e.g., a properly viewable density space, where the words are not too small to be legible). Here then, the pins may be activated (e.g., highlighted) when an operator controlled cursor or the like is engaged therewith to then enable a "pop-up" box or the like to be displayed. Such a pop-up box may then have the relevant information for the operator to make a desired next action.

Figure 7:
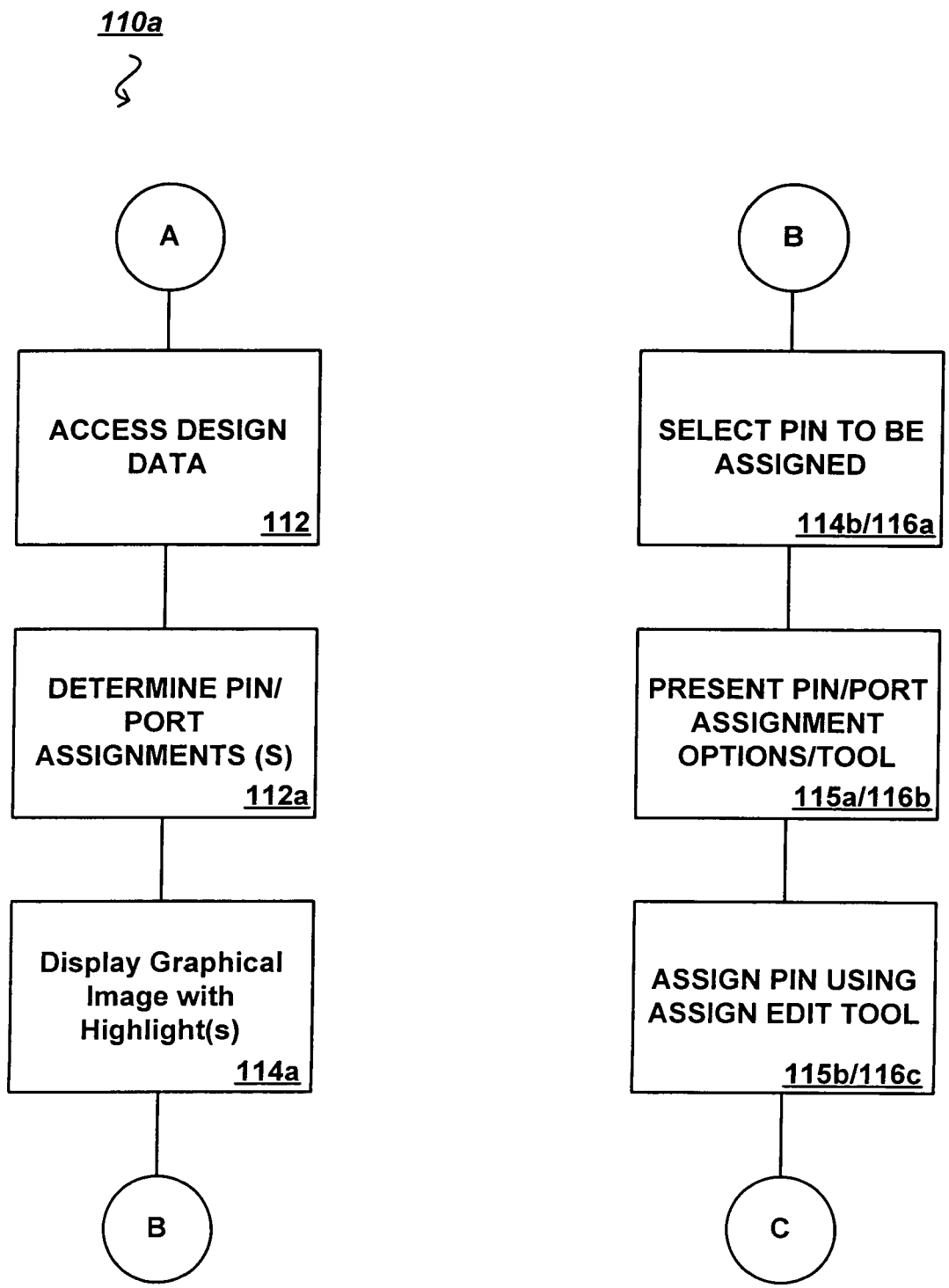
FIG. 7 is another flowchart depicting alternative functionality of an exemplary embodiment of the present invention.
Figure 8:
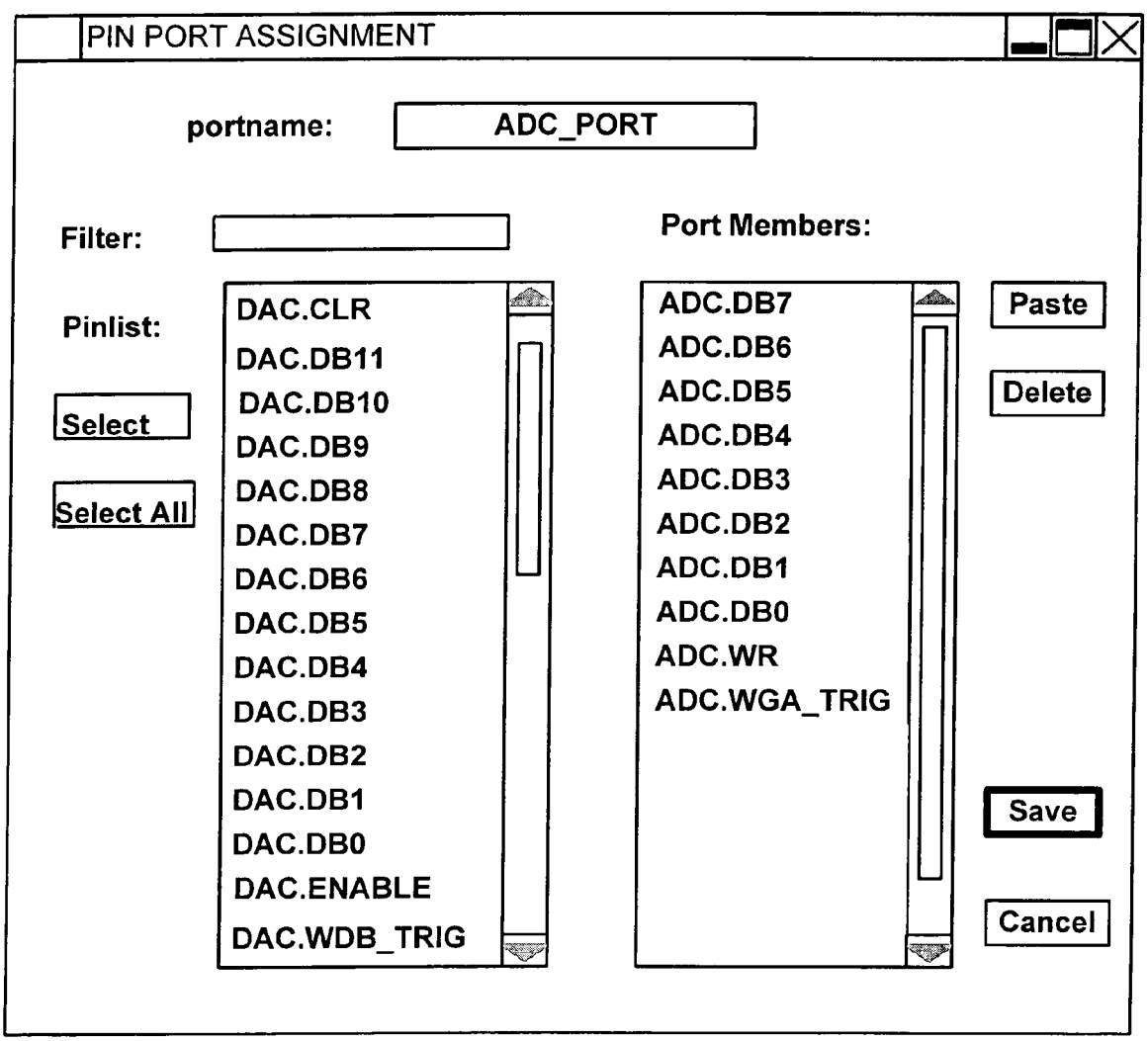
FIG. 8 is another portion of a user interface screen which may be used in accordance with an exemplary embodiment of the present invention.

Note, this sort of process or sub-routine is shown by the three steps 112, 112*a* and 114*a* of the first part of the alternative process 110*a* in FIG. 7. More particularly, the first step of accessing design data 112 is as shown and discussed before; however, the introduced sub-part thereof involving the computer evaluation of the data is shown here separately as step 112*a*, labeled essentially as determining the pre-existent pin to port assignment(s). This is the computer search/analysis/comparison referred to above. The next step of display 114*a* is then shown following this step 112*a*.

In one embodiment, e.g., where there is no pre-assignment of pins, then the initial computer comparison of the graphical image will be against no pre-assignment data, or data which reveals no pre-assignment, and then the computer may simply reflect an otherwise unhighlighted (or fully highlighted) graphical image, indicating for example that all of the pins are not assigned. Then, the iteration of assignment steps (FIGS. 4 and/or 5) may take place, e.g., steps 114 and 116 (and perhaps also step 115). Otherwise, perhaps there has been a pre-assignment of pins (e.g., before step 112 in FIG. 4, or as shown by step 113 in FIG. 5), though for whatever reason, imperfectly such that some one or more pins may remain not assigned. Then, the computer search and/or evaluation/comparison of the test program data, i.e., pin assignment data with the graphic image data can then reveal (through certain computer image manipulation, e.g. enabled pin indications) which pins may not have been assigned. Then again, pin assignment steps 114 and 116 (and perhaps also step 115) can be performed. Note, the computer evaluation/comparison may be automatic, as part of the "accessing" step or steps or this also may await an operator initiation, such as by an operator "clicking" an appropriate button, such as a "Find Unassigned Pins" button (not shown), or by selecting the desired pins-of-interest radio button (see buttons 212–216 described below). Note also that in an appropriate setting such as a computer control, such buttons may be found in a graphic user interface menu structure or as a dialog button or buttons or otherwise as may be understood in the art. Thus, the capabilities of this invention could be invoked from a computer display (menu item, dialog button or otherwise), or may be automatic or otherwise initiated (e.g., other computer input, keyboard, mouse or stylus selection or voice or computer communicative media input).

Involvement of an operator to view the computer presentation/display of the compared/evaluated data and interact with the computer may then be described in more detail as follows. For example, step 114 (FIGS. 4 and/or 5) can thus also include an operator evaluation of that which is displayed by the computer (e.g., graphic representation/image or like visual depiction), and the operator may then make a determination if for example whether a particular highlighted/visually indicated pin may indeed be "assigned as desired." For example, some pins may in some test situations not need to be assigned at all. Thus, the human operator may help determine that even though unassigned, the pin may yet be disposed "as desired." Note, this determination may be by computer or by human, noting that a human operator may be instrumental at any one or more of these steps such particularly as in the display step 114*a* and/or the pin assignment step 116 (or steps 115 and/or 116) such as by viewing the display after step 114*a* and/or then determining interactively which pin or pins to select for assignment and in which order.

In any case, an operator/computer interaction may proceed as follows (see e.g., FIG. 7, also with a slightly modified process 110*a*). As introduced above, in a first set of steps (e.g., steps 112, 112*a* and 114*a* in FIG. 7), the computer is involved with the data access, analysis and display of a graphical representation of an IC/SOC 10 (as shown in FIG. 6, for example), preferably in a display window 200. Then, in the human operator interactivity sub-routine (shown separately from but yet continuing after step 114*a*), the human operator may then decide to select a pin, e.g., pin 9, for assignment, at which point the operator moves the computer cursor, or arrow as shown in FIG. 6, over the graphical representation of that pin itself or the associated text (as shown in FIG. 6), which text may be a textual name of the associated pin, and then the operator may "click" (or double-click, according desired convention) to select the pin (such selection perhaps being indicated by another form of highlighting such as the box around the text as shown in FIG. 6). This first operator step may also be represented as step 114*b*/116*a*, as shown in FIG. 7. Then, the computer can respond to the operator selection by then presenting a pin/port assignment option for the operator. See step 115*a*/116*b* in FIG. 7. As introduced above, this could take the form of accessing a pin/port assignment tool which could have one or more selection buttons, data entry areas and/or dialog boxes such as those shown in the display window (pop-up box) 300 in FIG. 8. These may then be used in a substantially known/conventional manner to assign the selected pin to a port of the operator's choosing. See step 115*b*/116*c* in FIG. 7. Note, the alphabetical suffixes attached to the numerical labels of the process steps of FIG. 7 are intended to merely modify and yet continue to indicate the potential relationships of these FIG. 7 steps to those described above relative to the processes of FIGS. 4 and 5 (inter alia). Note further that all of these steps (FIGS. 4, 5 and/or 7) may be operator driven (i.e., may not proceed until prompted by the operator), though they need not require a human operator's intervention. Rather, so long as the computer is given enough criteria, it could take each of these steps, after evaluating/comparing the assignments relative to the graphical representation of the IC/SOC, the computer could then select a pin or pins not previously assigned for processing according to process 110, i.e., assigning them as desired in the iterative process so described.

Note further that though a "pin" is described in each of the steps 114, 115, 116 and/or 118 more than one pin may be involved at each of these steps. For example, more than one pin may be determined to not have been previously assigned in step 114 and then in the assignment step(s) 115, 116 more than one pin might be assigned to a port at a time, as by the system/method providing the alternative of allowing more than one pin (e.g. a group of pins) to be "selected" (e.g., clicked on, individually or as a group) for assignment (e.g., step 114*b*/116*a* of FIG. 7 may allow for "selection" of more than one pin at a time and/or then step 115*b*/116*c* might also allow for "assigning" those more than one pins at a time). This might be a preferred option and/or have more utility when it might be that more than one pin might be desired to be assigned to a single one of a selection of possible ports.

A further set of alternatives includes the use of similar process steps to evaluate whether one or more pins may have been erroneously assigned to a plurality of ports, contrary to the desiderata of the particular test program or programs to be run. In such an embodiment, the same general process steps of method(s) 110 (and/or 110*a*) could be equally viable here as well. The primary difference is that the evaluation of step 114 is directed at determining whether the pins are erroneously multiply assigned rather than not assigned at all (i.e., the phrase "assigned as desired" in step 114 applies equally to non-assigned as well as multiply-assigned pins). When it is determined that the pins meet this latter erroneous assignment criteria, then they may be made subject to re-"assignment" pursuant to step(s) 116 (and/or 115). The primary preferred embodiment for this alternative mode of operation involves the difference in how the computer evaluates the comparison of the graphic and test program data. Thus, it is the computer in the preferred embodiment which finds the multiply assigned pins and reveals these to the operator by highlighting these pins as such when in this mode of operation. All other steps of the process(es) 110 (and/or 110*a*) would then be the same. Especially pertinent here may be the operator (or computer) knowledge of when a multiply-assigned pin might be not "desired." There are common instances wherein a pin may be desirably multiply assigned, the pin may indeed desirably communicate with multiple cores and/or may have other reasons for such a multiple assignment. However, it may primarily be when such a multiple assignment might interfere with parallel or concurrent testing, that it would be "undesirable." Thus, human operator intervention may be preferred for providing this decision-making (though here as well, if the computer is given enough information, it could handle these assessments and re-assignments according to the presently described processes without the human intervention).

Note further that any of these alternative embodiments may be mutually exclusive, or could function serially or even simultaneously. If mutually exclusive, they may exist separately (not necessarily shown). However, co-existence may take various forms; for example, simultaneous co-existence of the non-assigned and multi-assigned processes might be demonstrated in the graphic representation of the device 10 such that different/discrete highlight means might be simultaneously shown on the single image 10 concurrently. For example, one highlight color or shade or text indication (or otherwise) might be used to indicate the "not-assigned pins" while another discrete highlight color or shade or text indication (or otherwise) might be used to simultaneously indicate "multi-assigned pins." Then, the user (and/or computer) could continue through the iterative process(es) of FIGS. 4, 5 and/or 7 to assign the pins (of either sort) to appropriate, desired ports.

Moreover, in another view of the two embodiments possible co-existence, it could be as shown in FIG. 6, wherein they may be selected to be active at appropriately discrete intervals, such as is shown by the status indicator or radio button array 210 (button 212 is shown filled-in, thus indicating that it is the active mode, "pins not assigned"; as opposed to the button 214 which is open in FIG. 6 to indicate that it is not the active mode). Other means for selecting between these modes could alternatively be used.

Figure 9:
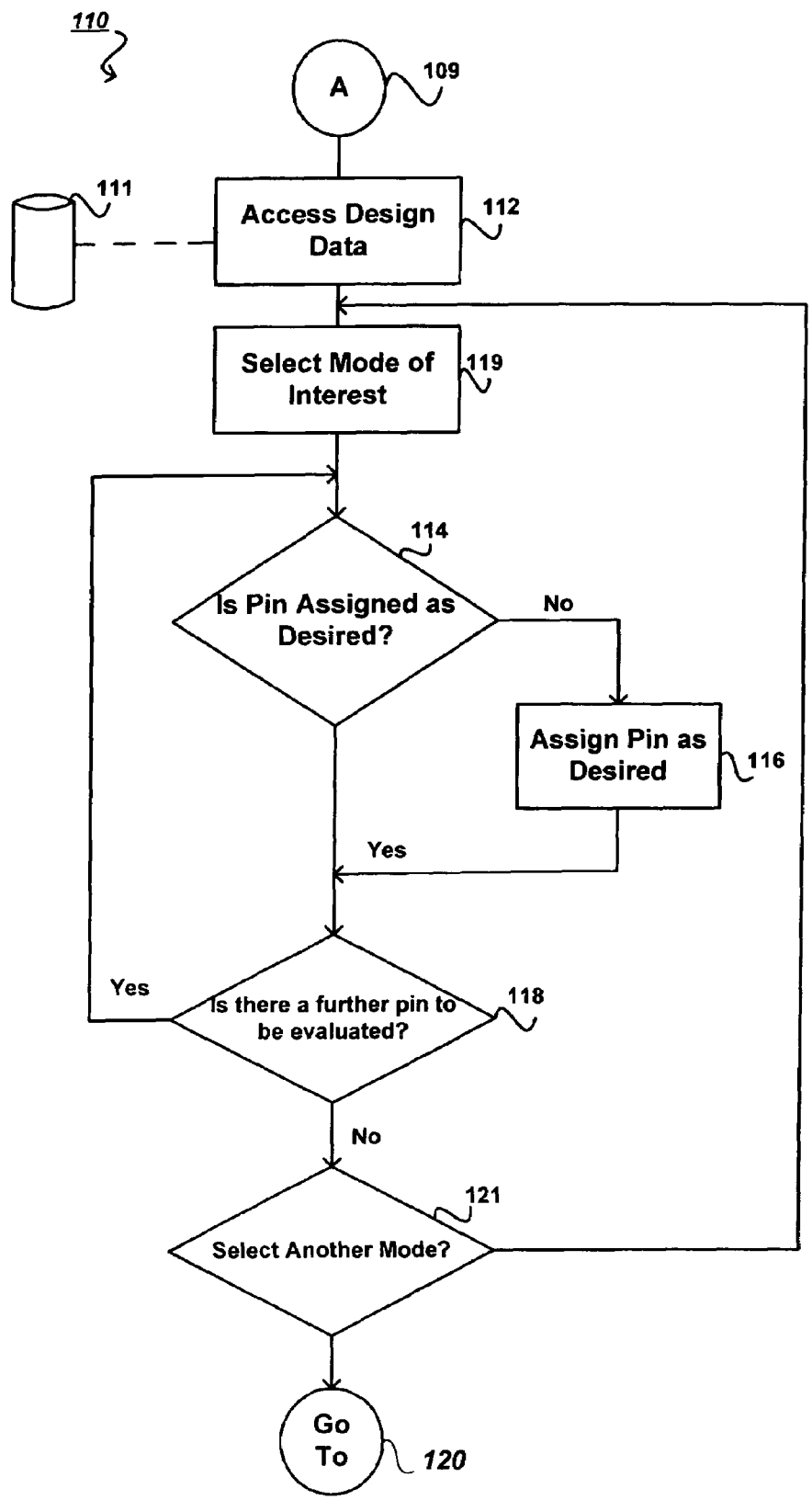
FIG. 9 is another flowchart depicting the functionality of another exemplary embodiment of the present invention during another version of use.

A representation of how these two alternative embodiments might operate functionally relative to each other is shown in FIG. 9, wherein an additional initial step 119 is shown after the initial data access step(s) 112 et al. (here again, the test program data may be considered to have been acquired also, and acquired either before during or after or as a part of step 112). This next step 119 is directed to the selection of the mode of operation, e.g. "non-assigned pins" or "multiply-assigned pins." Then, the selected pins-of-interest ("non-assigned pins" or "multiply-assigned pins") can then be highlighted in the display of the graphical image of the IC/SOC 10 (see e.g., FIG. 6 where the "non-assigned pins" mode is selected). Otherwise, the pin selection and assignment steps (114, 116 and/or 118, inter alia) may then occur as before for either of these modes. Then however, as shown further in FIG. 9, a later decision diamond 121 may be inserted into this overall process to provide for returning to the mode selection step prior to ending or leaving, via GoTo circle 120, the method 110 of the present FIG. 9. Then, another mode (such as the multiply-assigned pins") may be selected as for example by selecting another radio button (e.g., button 214), and the process of FIG. 9 repeated for this next mode. A plurality of other modes could also be inserted here. Or, it may be decided that no further modes are desired, and the process then continues to the GoTo step which provides for entering other test set-up steps or enters into the actual test process. Other non-nested alternative methods may also be available for these modes of operation; i.e., these modes might have completely separate routines for operation which could operate completely (or at least partially) independently of each other.

A further alternative mode is shown in FIG. 6 by the radio button 216 adjacent the text "Show Pins Assigned to Port." The actual port definitions (i.e., all of the pins assigned to a particular port) may then be highlighted port by port using such an option. In this mode, a particular port is selected (as for example first selecting the radio button 216 which may be adapted to activate a port selection field such as field 218, which will then allow the user to select (by number, title or otherwise) a port of interest (up and/or down arrows may also be provided as shown for this purpose) and the corresponding pins assigned thereto may then be highlighted in the graphical representation of the IC/SOC 10. Then, the operator has available the options of selecting one or more pins (from the highlighted or perhaps more often the un-highlighted group of pins) according to the processes set forth above (or otherwise) and assigning or re-assigning them as desired. This may be for pins highlighted per port, or those which are not highlighted for that particular port. For a more particular example, when a particular port is selected and the computer may then show by highlighting that a certain selection or grouping of pins is assigned to that port. But then the operator may desire that an additional un-highlighted pin be assigned thereto, so the operator may then click that non-highlighted pin and, following the above steps (or the like) may proceed to assign that pin to that port. This is envisaged as a further tool for either assigning pins as described, or alternatively for graphically checking/verifying what pins are assigned to what ports. In any case, this sub-routine may then also provide a user friendly means for re-assigning undesirably mis- or non-assigned pins.

Note, once in the pin/port editing capability (process sub-routine or tool), not only may pins be assigned or re-assigned to one or more ports. Other pin and/or port definitions may be created and/or edited. For example, it could occur that a pin is not defined and may then be newly defined, or perhaps a new port is desired, and thus this could be created at this time as well.

Note, various alternatives are available relative to what may graphically shown, and thus the descriptions herein are not intended to be limiting as to what might be shown in any particular embodiment. For example, although a visual depiction of the device would preferably be imported from whatever CAD package was being used to design the device packaging, this is not required. The image may be generated in any of a variety of ways and may include the operator creating their own version on the controller 22. In any case, this image would preferably be used to provide a reference framework for any visual highlighting to be done on the image. The highlighting to be used in any particular embodiment is also subject to a great deal of variability, as the unassigned pins might in one embodiment be highlighted using bright colors so that they are immediately visible to the operator. The highlight color or method might be made user selectable, or could be a fixed color value designed to create maximum contrast, and high visibility. A text list of the pins should also be made available as part of the graphic image, since this may often be a desired data form in most operator intervention situations. Graphic menus or buttons or the like will generally be preferred for invoking the capabilities of this invention, as for example from a menu item during multi-port test development. Preferably also, software links would be provided to correctly activate editing capabilities for the Multi-Port pin assignment. These capabilities would be activated when the pins were selected within the graphical representation.

As introduced above, there is shown in FIG. 6 a user interface screen 23 with a graphic window 200 for performing the pin assignment/verification according to the present invention. The user interface screen 23 may be generated in high level software using a variety of graphical user interface techniques that are well known in the art for entering and displaying data on personal computers and workstations. The user interface screen 23 may typically be interfaced to a personal computer or workstation or controller 22 according to known techniques, allowing for computer control according to selected parameters. Programming the controller 22 may preferably be performed using a menu hierarchy containing a set of user interface screens that allows the user to control process steps in a logical and intuitive manner. A graphic representation window such as window 200 may have been selected from a menu hierarchy; however, various alternative displays may be used, according to any of a variety of data display techniques known in the art.

Though not separately shown, the overall test process may then proceed to actual testing where the IC/SOC under test is interconnected with the ATE (if not previously so connected) and then the IC/SOC may then be provided, by the ATE, with appropriate signals to facilitate testing, such as digital and/or analog parameter testing, among others. Such signals may include, but are not limited to: one or more power signals; one or more clock signals; one or more reset signals; one or more critical signals, and; one or more test control signals, among others. Test response signals, i.e., data may then be communicated to and received by the ATE, with the data being received in any suitable manner, e.g., intermittently throughout the testing cycle, or after testing has been completed. These test parameters may then be evaluated to determine whether the IC/SOC is functioning as desired. If it is determined that the integrated circuit is not functioning as desired, the process may proceed to verification of the test results, such as by repeating some one or more of the test steps, and if the determination once again is made that the integrated circuit is not functioning as desired, the process may proceed to rejection of the IC/SOC. If, however, it is determined that the integrated circuit is functioning as desired, the process may terminate with a positive indication.

By utilizing the test system with the methods of the present invention, assignment and/or verification of pin matching of an IC and/or SOC with an ATE is not necessarily limited by the IC/SOC or the ATE, such as by the tester channel configuration of a given ATE. For instance, the ATE will be assuredly programmed to provide test signals to all of the minimum desired pins or pads of an integrated circuit or SOC under test. Note though, that not all pins or pads of an IC/SOC may be required and/or desired to have test signals provided thereto, i.e., some pins and/or pads may be used to communicate signals from the IC/SOC to the ATE.

The present invention may be separate from and communicative with or may be included on/in automated test equipment. It may be useful in a variety of automated test equipment environments and/or with various ATEs. An example is that the present invention may find particular utility with, but is not limited to use in the Agilent 93000™ automated test equipment available from the assignee of the present invention, Agilent Technologies, Inc. located in Palo Alto, Calif., USA.

As described above, the present invention is adapted to facilitate automated test equipment functionality for testing integrated circuits. In this regard, some embodiments of the present invention may be construed as providing either methods or systems for setting up the testing of an IC/SOC, minimally including in some examples the steps of: accessing an electronic image of the IC and/or SOC; determining whether one (or more) pin(s) of the IC are assigned as desired; and assigning such a pin (or pins) if not so assigned, and iterating the process as desired for the pins of interest. Or, developing at least a portion of an integrated circuit test in a multi-port automated test environment including accessing design data including an electronic image of an integrated circuit to be tested; determining whether a pin of the integrated circuit is assigned to a port as desired; and assigning such pin to a port if not assigned as desired.

Relative to automated test equipment itself, some embodiments may be considered more directly concerned with test set-up systems or even test systems for testing integrated circuits, with such systems being implemented in hardware, software, firmware, or a combination thereof. In a preferred embodiment, however, the test set-up system or test system is implemented as a software package, which can be adaptable to run on different platforms and operating systems as described herein. In particular, a preferred embodiment of the test set-up or test system, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Note the controller 22 as may be used here (and as shown schematically in FIGS. 1 and 3) may be or may include a computer or processor-based system or the like which may be a part of and/or facilitate control functionality (described in detail hereinafter) of the test system 20 of the present invention. Such a computer system may generally include a processor and a memory with an operating system (none of which being separately shown here). The memory may be any combination of volatile and nonvolatile memory elements, such as random access memory and/or read only memory. The processor may accept instructions and data from memory over a local interface, such as a bus or busses (none shown). The system also includes one or more input devices and/or one or more output devices (not shown, other than display 23 as introduced above). Examples of input devices may include, but are not limited to, a serial port, a scanner, a local access network connection, keyboard, mouse or stylus, or the like. Examples of output devices may include, but are not limited to, a video display, a Universal Serial Bus, or a printer port. Generally, this system may run any of a number of different platforms and operating systems, including, but not limited to, HP-UX™, LINUX™, UNIX™, SUN SOLARIS™ or Microsoft Windows™ operating systems, inter alia. The test system 20 of the present invention, the functions of which shall be described hereinafter, may reside in the computer-type memory and may be executed by the computer-type processor.

Thus, some embodiments of the present invention may be construed as providing computer readable media; the computer readable medium perhaps including a computer program for facilitating setting up testing of an IC/SOC and incorporates logic configured to enable the ATE controller to access an electronic image of the IC and/or SOC; then providing for determining whether one (or more) pin(s) of the IC are assigned as desired; and assigning such a pin (or pins) if not so assigned, and iterating the process as desired for the pins of interest.

In one embodiment, a system of the present invention may include an integrated circuit or system on a chip (IC and/or SOC) disposed in electrical communication with at least a portion of the ATE, with at least one pin or pad being configured as a signal interface for and/or between components in/on the IC/SOC and components (such as the ATE) external to the IC. An ATE test protocol which is adapted to measure at least one parameter of the IC/SOC as communicated through the at least one pin or pad may then also be provided.

The foregoing description has been presented for purposes of illustration and description. It is not intended to be exhaustive or to limit the invention to the precise forms disclosed. Obvious modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method comprising:
    accessing design data including an electronic image of an integrated circuit to be tested;
    determining whether a pin of the integrated circuit has been assigned to a port in a multi-port automated test environment;
    enabling a displayable pin indicator based at least in part upon the determination of whether a pin is assigned to a port; and
    displaying the electronic image and the displayable pin indicator.

2. A method according to claim 1 wherein the displayable pin indicator is indicative of a pin not assigned to a port.

3. A method according to claim 1 wherein the displayable pin indicator is indicative of a pin assigned to a plurality of ports.

4. A method according to claim 1 wherein the displayable pin indicator is indicative of a pin which is assigned to a port.

5. A method according to claim 1 which further includes iterating the determining, enabling and displaying steps on a pin by pin basis for a group of one or more pins.

6. A method according to claim 1 in which the determining, enabling and displaying steps are performed for a group of pins.

7. A method according to claim 1 wherein the steps of enabling and displaying a displayable pin indicator comprises highlighting selected from the group consisting of: filling-in, shading, coloring, grayscaling, brightlining, cross-hatching, blinking, shimmering, animating, adding text, encircling, boxing and highlighting associated text, and enabling pop-up indicators.

8. A method according to claim 1 which further comprises selecting a pin to be assigned after the display of the electronic image and the displayable pin indicator.

9. A method according to claim 1 which further comprises assigning a pin to a port after the display of the electronic image and the displayable pin indicator.

10. A method according to claim 9 which further includes accessing a pin assignment capability for the step of assigning the pin to a port after the display of the electronic image and the displayable pin indicator.

11. A method according to claim 1 in which the step of determining whether a pin is assigned to a port includes determining whether the pin is not assigned.

12. A method according to claim 1 in which the step of determining whether a pin is assigned to a port includes determining whether the pin is multiply assigned.

13. A method according to claim 1 in which the step of determining whether a pin is assigned to a port includes determining whether an entire group of one or more pins is assigned to the port.

14. A method according to claim 1 which further includes:
selecting a mode of operation, wherein the mode of operation is indicative of which type of displayable in indicator may be enabled and displayed during the enabling and displaying steps;
performing at least one combination of the determining, enabling and displaying steps on a pin by pin basis for a group of one or more pins of interest.

15. A method according to claim 14 further comprising selecting a further discrete mode of operation after said step of performing at least one combination of the determining, enabling and displaying steps.

16. A method according to claim 15 in which each of the members of the group consisting of the mode of operation and the further discrete mode of operation are selected from the group consisting of: determining whether the pin is not assigned; determining whether the pin is multiply assigned; and determining whether an entire group of one or more pins is assigned to a port.

17. A method for developing at least a portion of an integrated circuit test in a multi-port automated test environment comprising:
accessing design data including an electronic image of an integrated circuit to be tested;
determining whether a pin of the integrated circuit is assigned to a port in a multi-port automated test environment;
indicating with a displayable indicator the result of the determining step; and
assigning a pin to a port as a result of the determining and indicating steps.

18. A method according to claim 17 wherein the step of determining whether a pin of the integrated circuit is assigned to a port includes determining whether the pin is assigned as desired; and wherein the step of assigning a pin to a port further includes assigning such pin if such pin is not assigned as desired.

19. A method according to claim 17 which further includes displaying the design data including the electronic image of the integrated circuit to be tested.

20. A method according to claim 19 further comprising: using a displayable indicator to highlight on the electronic image one or more pins which are not assigned as desired.

21. A method according to claim 17 which further includes accessing test program data including pin to port assignment data.

22. A method according to claim 21 which further includes:
evaluating the test program data in comparison to the design data to determine which pins are not assigned as desired;
displaying the design data including the electronic image of the integrated circuit to be tested; and
highlighting on the electronic image pins which are not assigned as desired.

23. A system for developing at least a portion of an integrated circuit test in a multi-port automated test environment, the system comprising:
an automated test controller which is adapted to communicate test information to automated test equipment, said controller also being adapted to provide for:
accessing design data including an electronic image of an integrated circuit to be tested;
determining whether a pin of the integrated circuit is assigned to a port as desired; and
assigning such pin to a port if not assigned as desired.

24. Apparatus comprising:
a computer readable medium; wherein a computer program is stored on the computer readable medium, the computer readable medium being adapted for developing at least a portion of an integrated circuit test in a multi-port automated test environment; said computer program comprising:
program code to access design data including an electronic image of an integrated circuit to be tested;
program code to determine whether a pin of the integrated circuit is assigned to a port; and
program code to assign such pin to a port if not assigned as desired.

* * * * *